US006674320B2

(12) United States Patent
Duffy et al.

(10) Patent No.: US 6,674,320 B2
(45) Date of Patent: Jan. 6, 2004

(54) SYSTEM AND METHOD FOR ORTHOGONAL INDUCTANCE VARIATION

(75) Inventors: Thomas P. Duffy, Chandler, AZ (US); Yi Zhang, El Segundo, CA (US); Malay Trivedi, Phoenix, AZ (US)

(73) Assignee: Primarion, Inc., Tempe, AZ (US)

( * ) Notice: Subject to any disclaimer, the term of this patent is extended or adjusted under 35 U.S.C. 154(b) by 0 days.

(21) Appl. No.: 09/978,613

(22) Filed: Oct. 16, 2001

(65) Prior Publication Data

US 2002/0060621 A1 May 23, 2002

Related U.S. Application Data

(60) Provisional application No. 60/240,665, filed on Oct. 16, 2000.

(51) Int. Cl.[7] .................................................. H03B 1/00

(52) U.S. Cl. ........................................ 327/555; 336/155

(58) Field of Search ................................ 327/552, 553, 327/555, 557, 110, 445, 453; 336/40, 155, 160, 165

(56) References Cited

U.S. PATENT DOCUMENTS

| | | | | |
|---|---|---|---|---|
| 4,445,082 A | | 4/1984 | Roberge et al. | |
| 5,672,963 A | | 9/1997 | Corrigall et al. | |
| 5,684,678 A | * | 11/1997 | Barrett | 363/17 |
| 5,757,099 A | * | 5/1998 | Cheng et al. | 307/105 |
| 6,188,209 B1 | * | 2/2001 | Poon et al. | 323/255 |

FOREIGN PATENT DOCUMENTS

| | | |
|---|---|---|
| DE | 3716415 | 3/1988 |
| EP | 0 246 377 | 11/1987 |
| EP | 1 001 520 | 5/2000 |

* cited by examiner

*Primary Examiner*—Shawn Riley
(74) *Attorney, Agent, or Firm*—Snell & Wilmer, L.L.P.

(57) ABSTRACT

A control system, method and apparatus is provided for an orthogonally variable inductor. A method and apparatus is also provided for voltage regulation. Regulation is provided without the use of Silicon devices, such as FET's, in the output current path. Efficient voltage regulation is provided via varying the inductance of a device in the output current path, and alternatively via varying the inductance and duty cycle. An orthogonal inductive device is provided to vary the inductance in the output current path. The orthogonal inductive device is an external H field device, a series method orthogonal flux device, or a combined core device. Furthermore, a variable inductor is also provided in filters, amplifiers, and oscillators.

22 Claims, 9 Drawing Sheets

SYSTEM AND METHOD FOR ORTHOGONAL INDUCTANCE VARIATION

CROSS REFERENCE TO RELATED APPLICATION

This application claims the benefit of, and priority to, U.S. Provisional Application Ser. No. 60/240,665 filed Oct. 16, 2000, which is hereby incorporated by reference in its entirety.

FIELD OF THE INVENTION

The present invention relates to a variable inductor. More particularly, the present invention relates to an apparatus and method for orthogonal inductance variation.

BACKGROUND OF THE INVENTION

Inductors possess the ability to store energy in their electromagnetic fields. This property has made inductors an important component in several categories of electrical circuits. As an example, inductors are important components in power conversion equipment, oscillators, and filters. In power conversion equipment, inductors are used in circuits which provide voltage rectification. Also, inductors are used in a variety of electrical devices such as voltage controlled oscillators, amplifiers, modulators, tuning circuits, and filters. In these and other embodiments, the natural resonant frequency of an oscillator or the cut-off frequency of a filter is determined, in part, by the combination of capacitors and inductors used in those circuits. In some instances, inductor inductance can be intentionally varied such as by mechanically changing the physical size of the core air gap. However, these mechanical methods have drawbacks such as the need for additional parts, complexity and bulk.

The inductors in these tunable devices have long been considered static inductance inductors, and this mindset has stifled growth and improvement in many electronics devices. This is particularly true of low voltage and high current power conversion devices. In one particular example, the demand for higher performance, microcontroller-based products for use in communication and processing applications continues to increase rapidly. As a result, microcontroller-based product manufacturers are requiring the components and devices within these products to be continually improved to meet the design requirements of a myriad of emerging audio, video and imaging applications. Microcontroller's are being designed with increasingly higher load demands and with lower voltage requirements. For example, many microprocessors are now designed to operate with a 3V power supply, and others are designed to work with less than a 1V power supply. This trend towards designing integrated circuits to operate at lower voltage levels is likely to continue. However, efficient power converters are increasingly difficult to design at these lower voltage levels.

Generally, AC power is converted to a steady DC power supply for microcontroller use. Furthermore, DC power is transformed from one voltage level to another through power converters. High efficiency power conversion is increasingly difficult to achieve as power converter output voltage requirements decrease and load current demands increase. This difficulty is largely due to the dominant conductive and switching losses of the output rectifiers. In prior efforts to improve the efficiency of the power conversion, standard rectifier diodes were replaced with synchronous field effect transistor ("FET") rectifiers. These FET based systems, also known as synchronous forward converter's ("SFC"), are inefficient at low voltages with high current, and when output voltages on the order of 1 Volt or less are desired, a better rectification method is needed.

An exemplary integrated circuit device using a non-variable inductor may, for example, include a synchronous FET rectifier. Synchronous FET rectifiers are used, for example, in a synchronous forward converter system 100, as shown in FIG. 1. SFC system 100 has a power source 102 and a load 116. SFC system 100 also has a transformer 104 with a secondary winding 122, a reset winding 123 and a transformer reset diode 106. SFC system 100 also includes a primary switch 108, an output rectifier switch 110, a freewheeling rectifier switch 111, an output inductor 112, output capacitance 114, and a feedback control circuit 118. In typical operation, source 102 is a DC power source providing DC source voltage to the transformer 104. Alternating ON and OFF states provided by controller 118 and primary switch 108 result in the generation of AC voltage. FET switches 108, 110, and 111 are synchronized by controller 118.

During an "ON" state, primary switch 108 and output rectifier switch 110 are both configured to be on while the freewheeling switch 111 is configured to be off. During the ON state, voltage on secondary winding 122 of transformer 104 produces a positive voltage proportional to the primary side voltage. This voltage is a function of the turns ratio of transformer 104. During the ON state the secondary winding 122 voltage minus the steady state load 116 voltage is applied across the inductor 112. This results in a linear increase of current in inductor 112.

During an "OFF" state, primary switch 108 and output rectifier switch 110 are configured to be off while the freewheeling switch 111 is configured to be on. Under this condition, magnetic forces within transformer 104 force the voltages on all windings to reverse polarity. These magnetic forces in conjunction with reset diode 106 facilitate reset of the transformer core to prevent saturation of the core material and subsequent loss of efficient transformer action. Because rectifier switch 110 is in the OFF state, the secondary winding 122 voltage is allowed to produce a negative potential in order to facilitate transformer 104 reset, without impacting power delivery to the load. Because freewheeling switch 111 is in the ON state, node 120 is coupled to the ground potential. This results in maintenance of current flow direction in output inductor 112. During the OFF state the equivalent voltage across the inductor 112 is 0 minus the load 116 voltage resulting in a linear decrease of current in output inductor 112.

The voltage and current ripple produced by the linear ramping of current in output inductor 112 is filtered by output capacitor 114 to produce DC current to load 116. In this manner, output rectifier switches 110 and 111 are synchronized with the operation of primary switch 108; however, this synchronization is a significantly complicated task. Accordingly, a need exists for a less complex method of operating a forward converter.

The average voltage value supplied to the load may also be regulated by SFC system 100 by varying the duty cycle with feedback control device 118. For example, device 118 can vary the percentage of time that the positive voltage is provided to the input node 120 of output inductor 112, in other words, changing the amount of time the power to the load is "off". Reducing the duty cycle, reduces the DC voltage at the load and thus regulates the output voltage. The steady state transfer relationship for the forward topology is:

$$Vout = VinD\frac{Ns}{Np} \tag{1}$$

Where:

Np=Transformer Primary # of Turns

Ns=Transformer Secondary # of Turns

SFC system 100 is inefficient at low voltages with high current. Furthermore, increasing the number of rectifiers to parallel the equivalent resistance results in diminishing returns due to $$\frac{1}{2}CV^2$$

and gate drive current losses. These energy losses are expensive, give rise to increased heat generation/removal issues, and impact the reliability of the device due to increased possibility of burn out of the rectifier. When SFC system 100 is operated at low voltage and high current, the bulk of the loss is concentrated in conducted and switching loss within the output rectifiers 110 and 111. Due to the placement of output rectifiers 110 and 111, current flows through one of the two devices at all times, and all current that reaches load 116 flows through these devices. The losses can be significant, and a need exists for an efficient rectifier which can regulate output voltage and can do so without the high power losses of the prior art.

Demand also exists for efficient and/or smaller power converters which can operate under low voltage/high current conditions in exemplary devices such as some high power laser diodes used in the telecommunication industry and arc welders. The use of non-variable inductors has also stifled development in other electronics areas, for example, inductors are used in combination with resistors and/or capacitors in circuits to form oscillators and filters. Non variable inductors are used in a variety of electrical devices such as power converters, rectifiers, voltage controlled oscillators, amplifiers, modulators, tuning circuits, filters, etc. In these designs, the natural resonant frequency of an oscillator or the cut-off frequency of a filter is set by providing set inductance and set capacitance values. However, often it is desirable to vary the resonant frequency or the cut-off frequency. To accomplish this variation, the circuits are configured to vary the capacitance of the capacitors. These variable capacitors may include trim capacitors and varactor junction diodes. Furthermore, banks of capacitors may be used to make large changes in overall capacitance by combining capacitors in parallel and in series. Each of these methods of varying the capacitance is expensive, requires extra circuitry and parts and is subject to additional failures. Furthermore, as semiconductor components, the capacitors are lossey elements with poor efficiencies. Therefore, there exists a need for more efficient methods of tuning the resonant frequency and cut-off frequency, and for a less complicated way of and ability to perform fine tuning.

SUMMARY OF THE INVENTION

The method and device according to the present invention addresses many of the shortcomings of the prior art. In accordance with one aspect of the present invention, a control system, method and apparatus are provided for varying the inductance of an inductor using orthogonal magnetic interference. In an exemplary embodiment, the orthogonal magnetic interference is generated by, for example, an external inductance ("H") field device, a series method orthogonal flux device, or a combined core device.

In accordance with another aspect of the present invention, a control system, method and apparatus is provided for altering an AC voltage for a DC load using a variable inductor. In an exemplary embodiment of the present invention, an orthogonal inductive device is provided to facilitate varying the inductance in the output current path. In a further exemplary embodiment, the orthogonal inductive device is, for example, an external H field device, a series method orthogonal flux device, or a combined core device. In accordance with another aspect of the present invention, DC voltage regulation is also provided by use of a variable inductor. In a further aspect of the present invention, regulation is provided without the use of silicon devices, such as FET's, in the output current path. In accordance with other aspects of the present invention, efficient voltage regulation is provided by varying the inductance of a device in the output current path, and alternatively by varying both the inductance and duty cycle.

In accordance with further aspects of the present invention, a filter apparatus and method is provided for variably tuning the cut-off frequency of the filter using a variable inductor. In accordance with another aspect of the present invention, an oscillator apparatus and method is provided for variably tuning the natural resonant frequency of the oscillator using a variable inductor.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components, such as buffers, voltage and current references, memory components and the like, comprised of various electrical devices, e.g.(resistors, transistors, capacitors, diodes or other devices), whose values may be suitably configured for various intended purposes. In addition, the present invention may be practiced in any microcontroller-based application, arc welder application, high power laser diode application, or similar high current/low voltage applications. Such general applications that may be appreciated by those skilled in the art in light of the present disclosure are not described in detail herein. However for purposes of illustration only, exemplary embodiments of the present invention are described herein in connection with a microcontroller.

Further, it should be noted that while various components may be suitably coupled or connected to other components within exemplary circuits, such connections and couplings can be realized by direct connection between components, or by connection through other components and devices located there between. To understand the various operational sequences of the present invention, an exemplary description is provided. However, it should be understood that the following examples are for illustration purposes only and that the present invention is not limited to the embodiments disclosed.

That being said, in accordance with one aspect of the present invention, a variable inductor is provided to overcome drawbacks associated with the use of non-variable inductors in certain electrical devices. The drawbacks include: inefficiency, heat dissipation, accuracy problems, tunability, design complexity, and added expense to construct the device. In an exemplary embodiment, the variable inductor is configured as an orthogonal transformer. The inductance of the inductor can be independently changed by the orthogonal transformer configuration without affecting the other components in the circuit. The orthogonal transformer makes changing the inductance of the inductor possible without coupling the circuit that is changing the inductance.

Figure 2A:
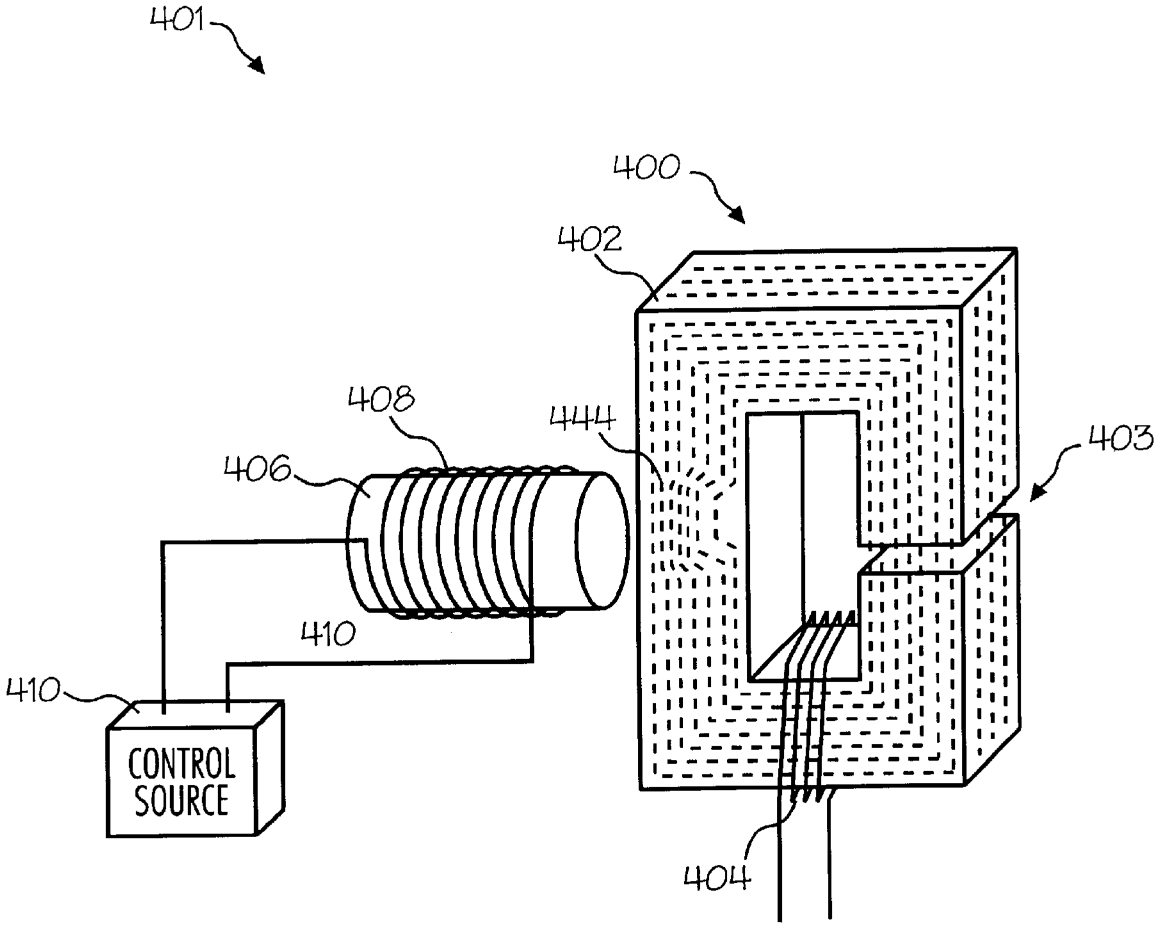
FIG. 2A illustrates a block diagram of an exemplary external H field orthogonal inductive device in accordance with an exemplary embodiment of the present invention.

The orthogonal transformer may be formed in a number of different ways. For example, in an exemplary embodiment of the present invention, and with reference to FIG. 2A, a variable inductor device 401 comprises an external H field device 400 which achieves electrically controlled variable inductance in the output inductor through orthogonal magnetic field coupling. External H field device 400 includes an inductor core 402 which may suitably include a gap 403, an output inductor winding 404, a gating core 406, a gating winding 408, and a gating source 410. In this exemplary embodiment, the inductance of the output inductor is changed to the effective inductance which is the inductance of the gating winding 408 in series with the output inductor winding 404, and which is determined by equations 2, 3 and 4.

$$L = \frac{uN^2Ae}{lp} \tag{2}$$

$$u = u_o u_e, \tag{3}$$

$$u_e = \frac{u_c}{1 + u_c\left(\frac{l_g}{l_p}\right)} \tag{4}$$

In these equations, L=Inductance, N=Turns, Ae=Magnetic Cross Sectional Area, u=Total Permeability, $u_o$=Permeability of Free Space, $u_e$=Effective Permeability, $u_c$=Core Permeability, $l_g$=Gap Length, $l_p$=Magnetic Path Length, and Ae=the cross sectional area of the core around its magnetic path length. Furthermore, in these equations, magnetic field lines 444 within the inductor core 402 are assumed to be uniformly distributed throughout the entire cross section of the core around its magnetic path length. This assumption is removed, and the cross sectional area Ae is made to vary by placing a magnetic field orthogonal to the evenly distributed magnetic field inside inductor core 402. The orthogonal magnetic field causes magnetic field lines 444 in inductor core 402 to crowd together in the region where the orthogonal magnetic field lines intersect with magnetic field lines 444. This crowding of field lines effectively equates to a reduction in mean cross section area Ae of the core resulting in lower inductance.

Although magnetic core 402 is shown as a C core, other magnetic cores may also be used with similar results, such as E type, torriod type, pot core, or other closed magnetic path core types. Furthermore, the external magnetic field, that causes the field lines of magnetic core 402 to crowd, may be generated by several devices. In an exemplary embodiment, the external H field is formed using an electromagnet, which comprises a gating source 410, a gating core 406 and gating winding 408. Current from gating source 410 is driven into gating winding 408 to form the orthogonal magnetic field that forces an inductance reduction in the output inductor.

In another exemplary embodiment, an external H field may be generated by physically moving a static field source, such as a permanent magnet, close to the inductor core 402 and alternately away from inductor core 402. In various embodiments, this movement may be created by moving the permanent magnet linearly away from and towards inductor core 402, or rotationally past inductor core 402. Furthermore, other similar methods may be used in the present invention for creating and controlling a variable external H field near inductor core 402 and changing the reluctance of the inductor core.

Figure 2B:
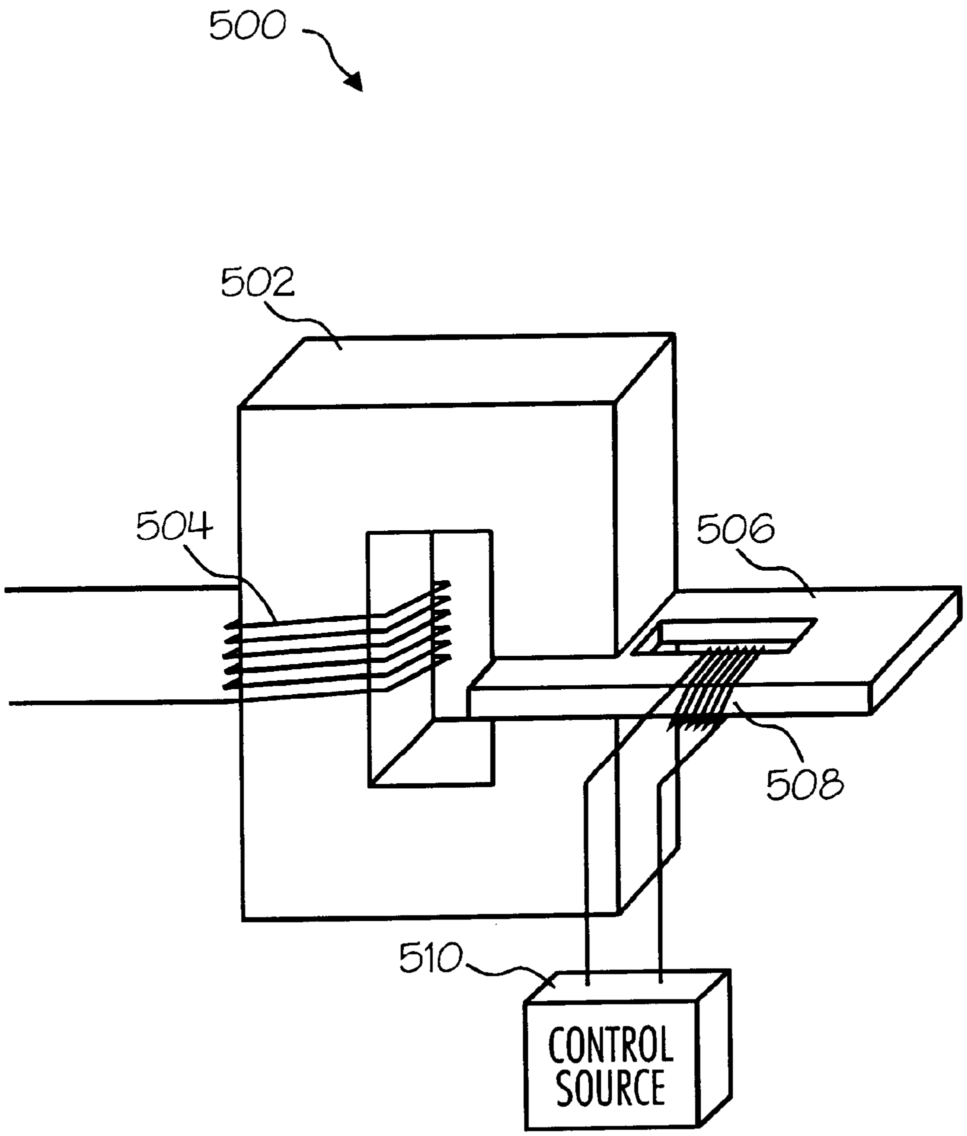
FIG. 2B illustrates a block diagram of an exemplary series method orthogonal inductive device in accordance with an exemplary embodiment of the present invention.
Figure 2D:
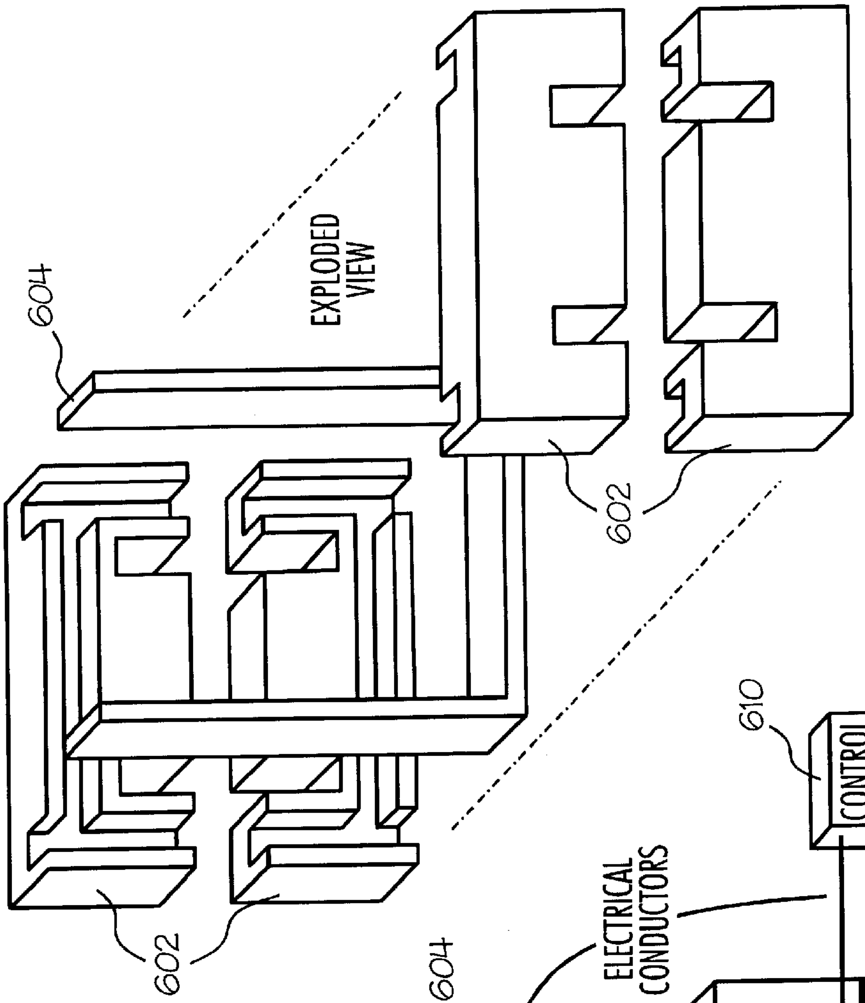
FIGS. 2C and 2D illustrate a block diagram of an exemplary combined core orthogonal inductive device in accordance with an exemplary embodiment of the present invention.

In accordance with another exemplary embodiment of the invention, and with reference to FIG. 2B, variable inductor comprises a series method orthogonal flux device 500 for achieving electrically controlled variable inductance. The "series method" orthogonal flux device 500 includes an inductor core 502, an output inductor winding 504, a gating core 506, a gating winding 508, and a gating source 510. In this configuration, the cross sectional area Ae remains constant, however, the gap length $l_g$ in the inductance equation is effectively altered. In this exemplary embodiment, a gating source 510 current is applied to a gating winding 508, forcing magnetic domains within the gating core 506 to align in an orthogonal direction to the flux path within the inductor core as set up by output inductor winding 504. The presence of orthogonal flux lines in the portion of gating core 506 that exist within the gap of core 502 alters the core permeability $u_c$ of the gating core 506 as perceived by the inductor core 502 flux. This effectively increases the gap length $l_g$ of the inductor core 502, effectively reducing the inductance of the output inductor, which is the inductance of the gating winding 508 in series with the output inductor winding 504.

Figure 2C:
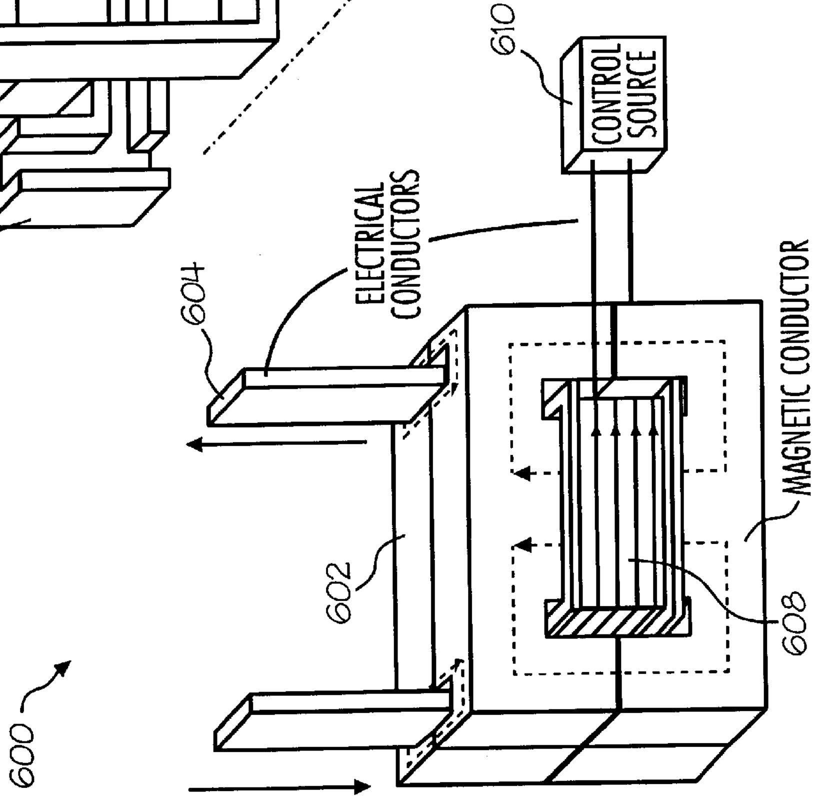

In accordance with another exemplary embodiment of the present invention, and with reference to FIG. 2C, a variable inductor comprises a "combined core" device 600 which electrically controls variable inductance. In an exemplary "combined core" device, magnetic structure system 600 includes a combined core 602, an output inductor winding 604, a gating winding 608, and a gating source 610. Gating source 610 is configured to provide current on gating winding 608, causing magnetic field lines in combined core 602 that are orthogonal to magnetic field lines in combined core 602 that are caused by current in output inductor winding 604. In this configuration, the presence of the orthogonal magnetic field lines changes the reluctance in the combined core and effectively reduces the inductance of output inductor winding 604.

Although output inductor winding 604 is shown as only passing through combined core 602 one time, in other embodiments, the number of inductor windings and gating windings may be varied as desired and using other configurations to facilitate construction. Combined core 602, in one exemplary embodiment, is formed of four pieces of core material through which windings may be suitably disposed. In an exemplary embodiment, gating windings 608 wrap around a center portion of combined core 602 with the windings being around an imaginary axis in a first direction. Output inductor winding 604, in this exemplary embodiment, wraps around the outside of the gating windings and around an imaginary axis in a second direction perpendicular to the first imaginary axis. Other physical embodiments, which similarly cause the flux lines from the gating winding to be orthogonal to the flux lines from the output inductor winding are included in the scope of this invention.

The gating source (i.e., 410, 510, or 610) may be driven or commanded by a controller circuit or device (not shown). The controller may, for example, cause gating source 410 to be ON during a first period of time, Ton, and OFF during a second period of time, Toff, causing a first inductance Lon and Loff respectively. In another exemplary embodiment, the gating source may cause a first current to flow during Ton and a second, different current to flow during Toff, again giving rise to differing Lon and Loff inductance values. Furthermore, the gating source may be controlled such that various inductance values at multiple inductance levels is provided.

Furthermore, in each exemplary variable inductor embodiment, the output inductor winding and gating winding comprise any electrically conductive materials, for example, copper material. Also, core materials comprise any magnetically conductive material, for example, ferrite material. The winding material for the gating core may or may not differ from the winding materials for the inductor core and the gating core material may or may not differ from the inductor core material.

In various exemplary embodiments, different orthogonal coupling devices may be used to vary the inductance of the variable inductor. Each embodiment provides a device configured to controllably generate magnetic field lines that are orthogonal to the output inductor magnetic field lines in the inductor core. Although the exemplary embodiments disclose an orthogonally coupled inductor with orthogonal magnetic field lines, the term orthogonal is defined herein to include not only 90 degree angles, but angles less than 90 degrees which nonetheless create a directionally coupled inductor. Right angle magnetic field lines are very effective at changing the effective impedance of the output inductor; however, due to space limitations or other design constraints, generation of magnetic field lines that are less than 90 degrees (less than orthogonal), but which nonetheless are capable of varying the inductance of output inductor may be appropriate.

That being said, an orthogonal variable inductor may be utilized in various applications to improve the performance of the device and overcome the limitations discussed with regard to similar circuits employing non-variable inductors. In one such exemplary embodiment, improvements are possible in voltage regulation circuits using variable inductors. One exemplary device is an integrated circuit. As discussed above, integrated circuits are being designed to operate at lower voltage levels. Integrated circuit power converters are thus being designed to operate at less than 5 volts, and even less than 1 Volt. Furthermore, in other applications, demand exists for efficient and/or smaller, power converters that can operate under low voltage, high current conditions. Efficient power converters are also useful, for example, for arc welders and for some high power laser diodes used in the telecommunication industry, which typically operate under low voltage, high current conditions. However, designing efficient power converters is increasingly difficult at these lower voltage levels.

Figure 1:
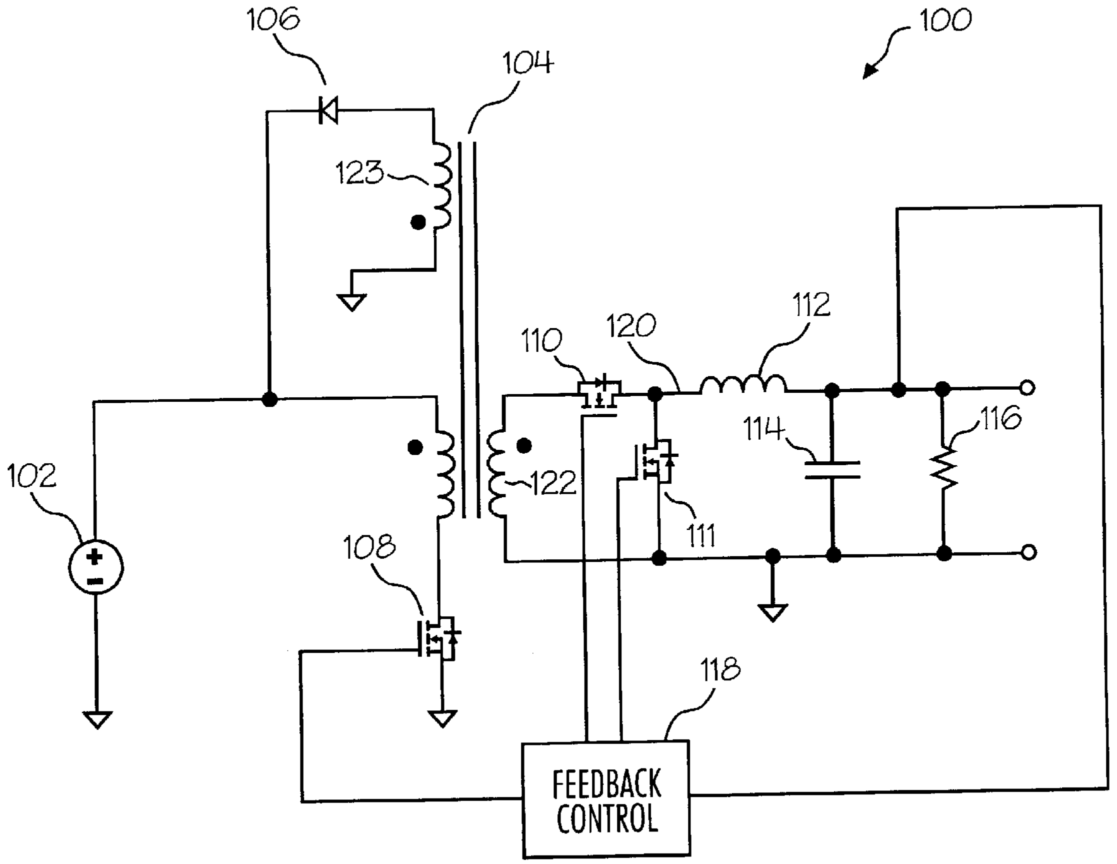
Fig. 1 Prior Art
FIG. 1 illustrates a prior art block diagram of an exemplary synchronous forward converter system using FET devices in the output current path.
Figure 3:
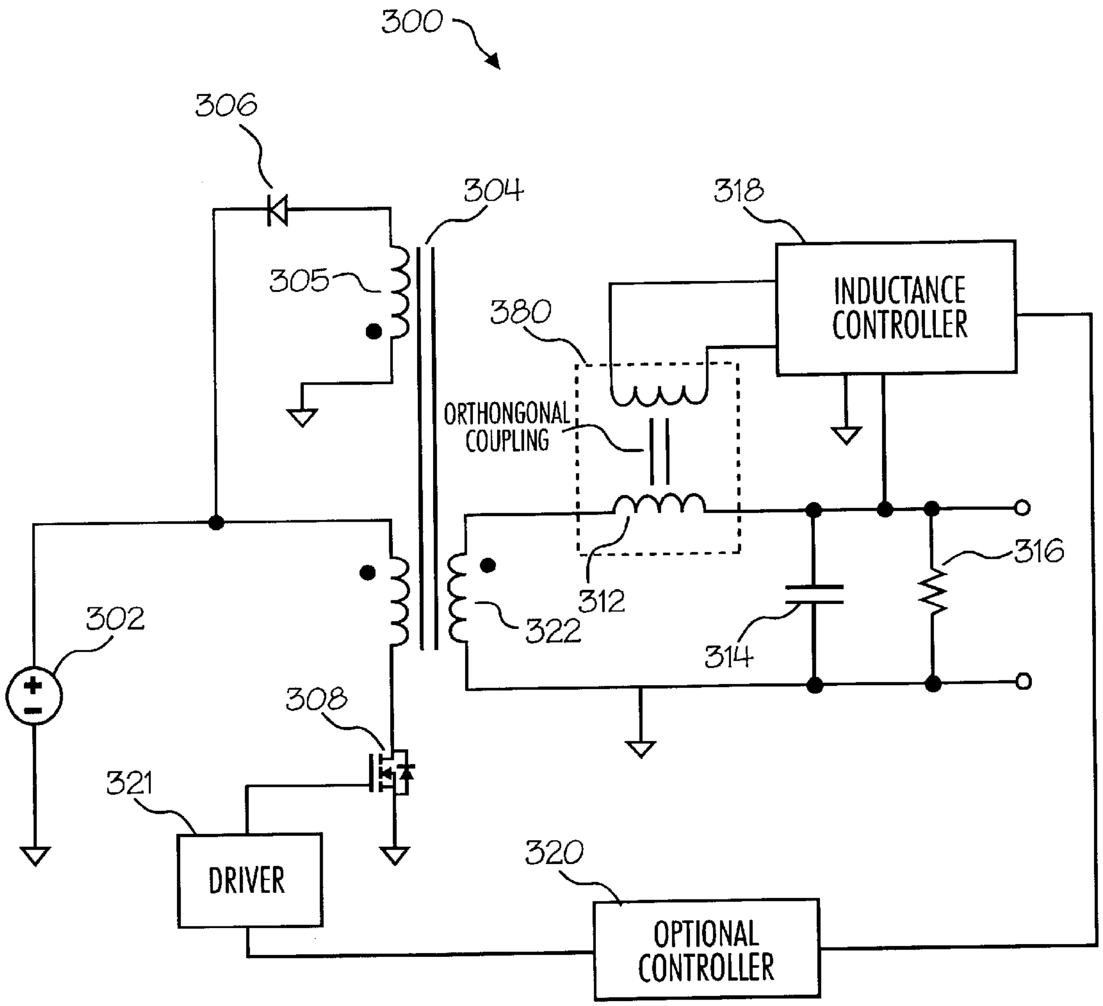
FIG. 3 illustrates a block diagram of an exemplary orthogonal inductive system in accordance with an exemplary embodiment of the present invention.

Because the silicon based output rectifiers 110 and 111, of FIG. 1 are responsible for much of the rectifier energy losses, a high efficiency voltage rectifier of the present invention is formed by removing the FET's 110 and 111 from the output current path and instead controlling the regulation via a variable inductor. In an exemplary embodiment, and with reference to FIG. 3, an orthogonal inductive device ("OID") system 300 is provided which does not include output rectifiers, and includes a variable output inductor 312.

In accordance with various aspects of the present invention, voltage regulation is provided with a variable inductor. In one exemplary embodiment of the present invention, and with further reference to FIG. 3, an exemplary orthogonal inductive device system 300 is a type of forward switching power converter ("SPC"). OID system 300 comprises a power source 302, a transformer 304, a transformer reset diode 306, a primary output switch 308, a primary output switch driver 321, an optional control circuit 320, a load 316, output capacitance 314, inductance controller 318, and an OID 380. OID 380 is presented with a new circuit convention to more clearly identify the orthogonal magnetic coupling.

In an exemplary embodiment, DC input source 302 provides DC voltage to transformer 304 in a topology that includes a reset winding and transformer reset diode 306. In other exemplary embodiments, a full bridge topology, half bridge topology, or push-pull topology may similarly be used. Furthermore, a flyback transformer topology may be combined with the variable inductor for a higher level of integration.

In one embodiment, a control device 320 controls a driver 321 to primary switch 308 to drive a substantially constant duty cycle signal on primary switch 308. Although presented as a constant duty cycle, small changes can be made to duty cycle to aid in regulation of the output. In accordance with other aspects of the present invention, control device 320 and inductance controller device 318 may be integrated into the same control device. Furthermore, although control devices 318 and 320 are described in an exemplary embodiment as hardware, it is anticipated that various combinations of software and hardware may be provided to perform the control functions discussed herein. Inductance controller circuit 318 is further configured to receive or be programmed with information for indicating the desired voltage regulation. Inductance controller device 318 is configured to monitor the output voltage level of load 316 and to determine appropriate command signals to cause OID 380 to change the inductance of output inductor 312 based on the desired voltage regulation.

In an exemplary embodiment of the present invention, an input transformer 304 presents an AC voltage waveform to the output inductor 312 in OID 380. Regulation of the AC current is facilitated by the output inductor's magnetic structure by altering the inductance at specified points in time. In this embodiment, during the positive voltage portion of an AC signal, the primary switch 308 turns ON and a secondary voltage is coupled to the orthogonally coupled inductor 380 (scaled by the turn ratio of transformer 304). Although in one exemplary embodiment, the turn ratio is unity, other differential transformer winding ratios may also be used.

During time period, ("Ton"), when primary switch 308 is ON, feedback control device 318 causes the inductance of output inductor 312 within orthogonally coupled inductor 380 to be equal to Lon. During time period ("Toff"), time period when primary switch 308 is OFF, feedback control device 318 causes the inductance of output inductor 312 within orthogonally coupled inductor 380 to be equal to Loff Lon and Loff are chosen to create a specific inductance ratio which provides voltage regulation. For example, Lon may be relatively smaller than Loff providing less resistance for the inductor to ramp up the current flow during positive voltage delivery, and more resistance to ramp down current flow during negative voltage delivery. This current slope change in the orthogonally coupled output inductor 312 occurs without impacting the volt-second balance of the transformer 304.

One analysis of the performance characteristics of an inductor involves equating the inductor current conditions just before and just after the moment in time when the transformer secondary 322 switches from positive voltage to negative voltage. Analysis of a circuit with non-variable inductors depends on the assumption that the inductance of output inductor 112, of FIG. 1, is a constant value, as in equation 1. However, this assumption is not valid when a variable inductor 312 is employed, as in FIG. 3. Variable inductor 312 may have multiple inductance values at different points in time.

In an exemplary embodiment, variable inductor 312 comprises two inductance values, namely, ("Lon") and ("Loff"). Lon represents the inductance of variable inductor 312 when the primary switch 308 is ON, and Loff represents the inductance of variable inductor 312 when the primary switch 308 is OFF. It should be appreciated however that variable inductor 312 may have more than two inductance values, or stated another way, variable inductor 312 may have inductances represented by L1, L2, . . . LN, where N represents a discrete number of states.

In accordance with an exemplary embodiment, a two state inductor, with inductances Lon and Loff, has a Vout proportional to Vin. For example, the proportional relationship is represented by equation 5, $$V_{out} = V_{in} D \frac{Ns}{Np} \frac{1}{\left[D - \frac{\text{ratio}}{(\text{ratio} - 1)}\right]}, \tag{5}$$

where ratio=Lon/Loff; however, other proportional relationships may be used in accordance with the present invention.

Figure 4:
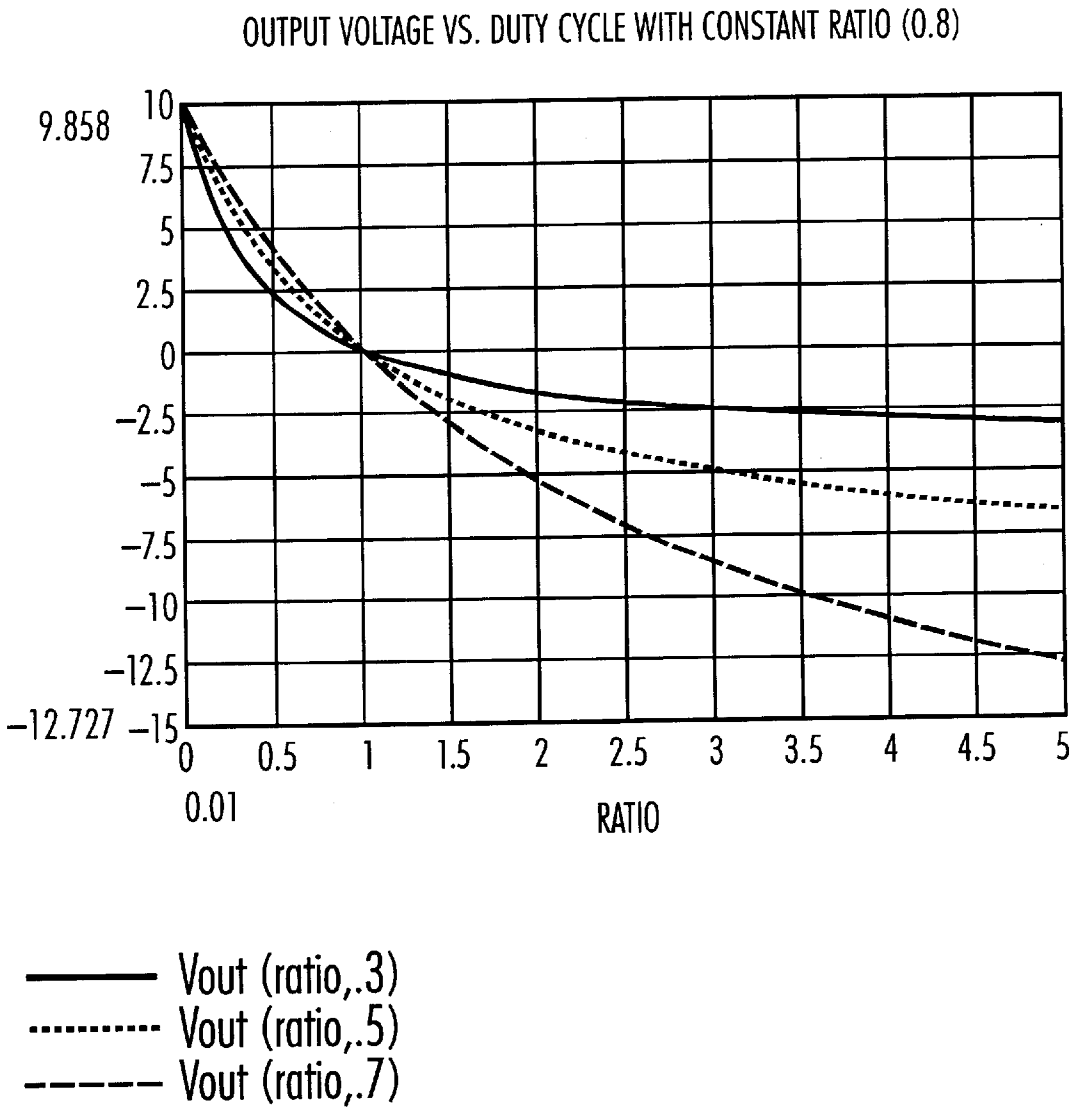
FIG. 4 illustrates a transfer function curve of an exemplary variable inductor in accordance with an exemplary embodiment of the present invention.

With reference now to FIG. 4, the output voltage of an exemplary orthogonal inductive device is graphed versus the inductance ratio Lon/Loff. The graph indicates the influence of the ratio between the ON-state (Lon) and OFF-state (Loff) inductance on the output voltage for an exemplary variable inductor. In generating this curve, for exemplary purposes, Vin was assumed to be 10 volts. In addition, curves were calculated assuming duty cycles of 0.3, 0.5, and 0.7, showing the ability to perform voltage regulation both by varying the inductance and the duty cycle. The voltage regulation is possible over a broad range, where fractional inductance ratios generate positive output voltages and ratios greater than one generate negative output voltages.

Figure 5:
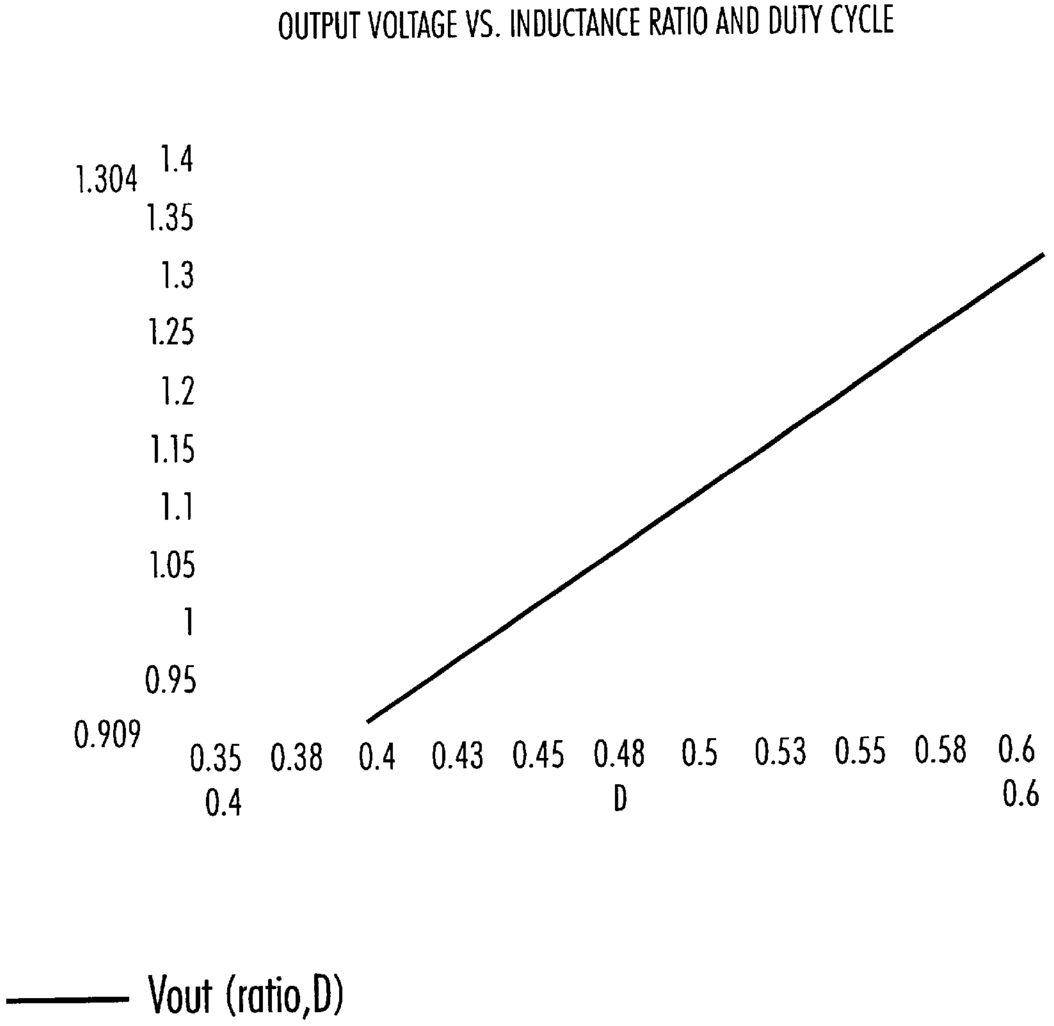
FIG. 5 illustrates a transfer function curve of an exemplary variable inductor in accordance with an exemplary embodiment of the present invention.

With reference now to FIG. 5, the output voltage of an exemplary orthogonal inductive device is graphed versus the duty ratio D, with Vin assumed to be 10 volts. The graph indicates the influence of the duty ratio on the output voltage for an exemplary variable inductor and assuming a constant inductance ratio. For a given inductance ratio, it is possible to make fine adjustments to the voltage regulation by varying the duty ratio.

Therefore, in accordance with various aspects of the present invention, a variable inductor facilitates voltage regulation without FET or other silicon devices in the output current path, while still achieving high efficiency. The efficient regulation is accomplished as a controller 318 monitors the voltage of the load 316. Controller 318 causes the inductance in the variable inductor to change based upon an error derived from the difference between the load 316 voltage and a reference voltage. The inductance is changed to a value which provides the appropriate combination of current slopes within the inductor 312 to provide regulation. In one exemplary embodiment, for example, a smaller inductance is used when positive voltage is present from the secondary winding 322, and a relatively larger inductance is used when negative voltage is present from the secondary winding 322.

In one aspect of the present invention, the use of a variable inductor allows for very fine voltage regulation control, which is difficult to achieve under low voltage/high current conditions using FET rectifiers. In a further aspect, the efficiency of the rectifier is improved. For example, in exemplary embodiments, efficiencies as high as 90% may be achieved at the 1V level at 100 Amps.

Furthermore, although in one aspect, use of a variable inductor facilitates voltage regulation, in other aspects, duty cycle may also be varied to regulate voltage in an OID system. In one exemplary embodiment, the voltage is regulated on a rough scale using a variable inductor, and the voltage level is further regulated on a finer scale using a variable duty cycle. In other exemplary embodiments, a rough adjustment is made by adjusting the duty cycle and a fine adjustment is made by adjusting the inductance. In other exemplary embodiments, the phase relationship between the time that each inductor changes inductance and the ON and OFF times may be varied to regulate the output voltage. In yet further aspects, the variable inductor may be combined with other parameter varying devices and other devices used to control the voltage regulation.

Figure 6:
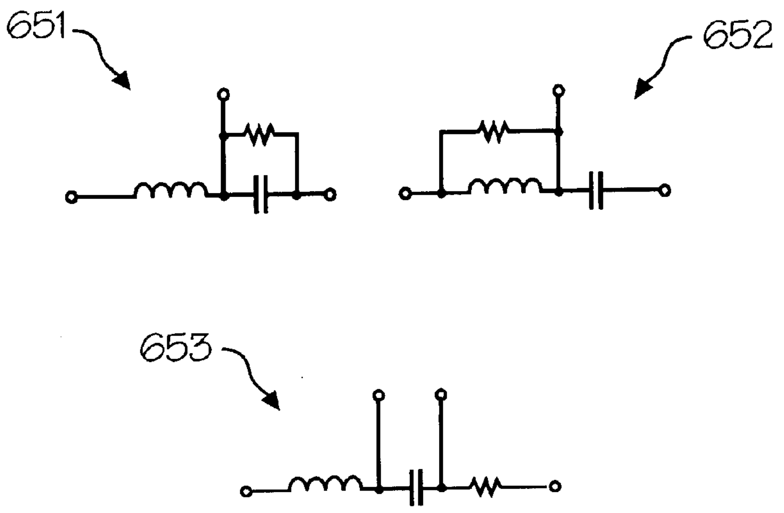
FIG. 6 illustrates exemplary resistor, inductor, and capacitor configurations for use in electronic applications in accordance with an exemplary embodiment of the present invention.

In accordance with further aspects of the present invention, the variable inductor may be used in other applications to tune the cut-off frequency of a filter or the natural resonant frequency of an oscillator. Inductors (L) are commonly used in conjunction with capacitors (C) and resistors (R) in practical applications. Exemplary configurations of R, L and C elements are shown in FIG. 6 Configurations 651 and 652 show two exemplary networks with a parallel arrangement of a resistor with one of the storage elements. Configuration 653 shows an exemplary series RLC arrangement. A host of other combinations may be achieved by suitably connecting the terminals of these networks or by combining several such basic networks to form higher order networks. The inductor (L) and capacitor (C) determine the natural resonant frequency of oscillators and the cut-off frequency of filters. Wherever present, the resistor (R) generally determines the damping, or settling time of the resonant network. Illustrative applications of inductors include voltage-controlled oscillators, amplifiers, modulators, tuning circuits, filters, etc.

Figure 7:
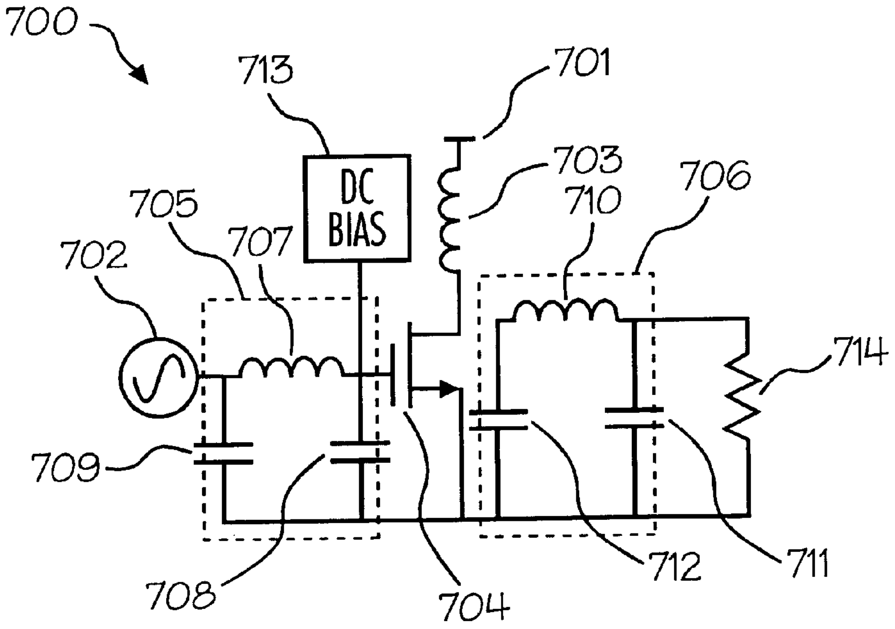
FIG. 7 illustrates a block diagram of an exemplary amplifier system in accordance with an exemplary embodiment of the present invention.

In various exemplary embodiments, variable inductor applications comprise circuits that have the ability to tune the resonance or the bandwidth of the LC network in real time. For example, an exemplary amplifier circuit 700 is shown in FIG. 7. In this exemplary embodiment, the amplifier consists of a single semiconductor switch 704 operating from a DC voltage source 701. An RF choke 703 provides DC isolation to the AC signal. The amplifier converts the small-signal AC input 702 to a linearly proportional signal with higher amplitude at the drain of the switch 704. The linearity and efficiency of signal amplification is determined in part by the switch characteristics, and in part by the coupling at the input and output terminals of the switch. Optimum coupling is achieved at the input terminals when the output impedance of the AC source 702 is the complex conjugate of the input impedance of the switch. Likewise, optimum coupling is achieved at the output terminals when the output impedance of the amplifier is the complex conjugate of the load 714 impedance.

In general, the impedance of switch 704 does not match the source 702 and load 714 impedance. Hence, impedance transformation circuitry 705 and 706 are attached at the input and output terminals of the switch to achieve the desired impedance matching. An exemplary implementation of the impedance transformation network 705 in the amplifier 700 shows an inductor 707 and two capacitors 708 and 709 connected in a "pi" configuration. The output impedance transformation network 706 is similarly implemented with inductor 710 and capacitors 711 and 712. The switch impedance generally varies as a function of bias conditions and process variations. Hence, various combinations of the network components are tried in an effort to achieve an acceptable impedance match. Said otherwise, without a variable inductor, locating the capacitor in the appropriate position on the circuit board to obtain the desired impedance matching is difficult. Furthermore, without a variable inductor, acceptable impedance matching is achieved by using several discrete parts or mechanically variable capacitors.

However, in accordance with an exemplary embodiment of the present invention, a variable inductor is used for inductors 707 and 710 allowing real time changing of the impedance of the input and output impedance transformation circuitry 705 and 706 respectively). The variable inductors further reduce the complexity of the circuit allowing simple non-variable capacitors to be used and reduce the capacitor placement difficulties.

Figure 8:
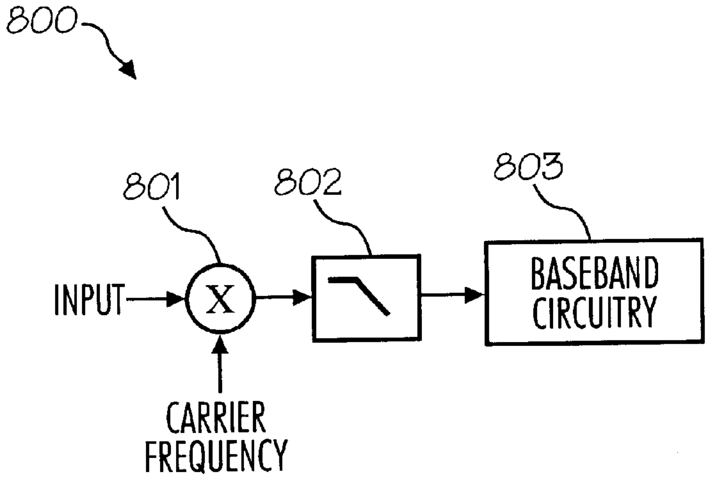
FIG. 8 illustrates a block diagram of an exemplary front-end demodulation circuit in accordance with an exemplary embodiment of the present invention.

FIG. 8 shows an exemplary front-end demodulation circuit 800 of a typical radio receiver circuit which is another exemplary application for the variable inductors of the present invention. The signal is modulated over a carrier frequency. Each channel has a unique carrier frequency. The function of the front-end of the receiver is to multiply 801 the incoming signal with the carrier frequency of the selected channel to demodulate, or shift, the signal to the audio frequency range. A low pass filter 802 then eliminates spurious noise before the baseband circuitry 803 can extract the actual signal. The carrier frequency used by the demodulator 801 is provided by an oscillator circuit. The oscillator circuit allows the carrier frequency to be electrically varied in a fine-tuning manner and in a compact and efficient circuit.

Figure 9:
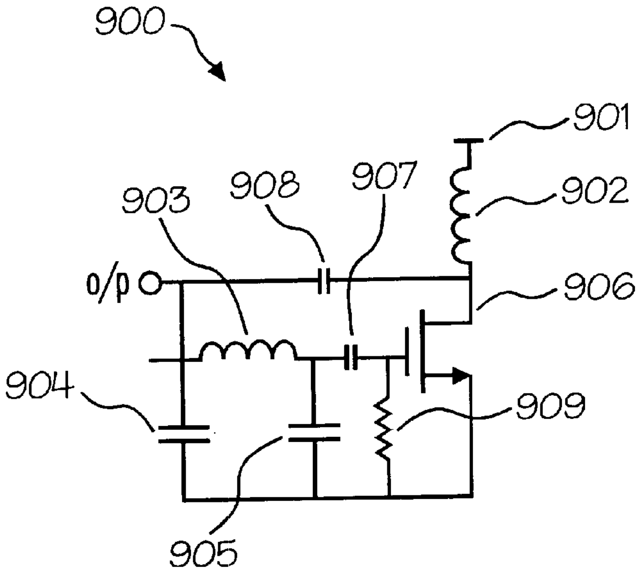
FIG. 9 illustrates a block diagram of an exemplary oscillator circuit in accordance with an exemplary embodiment of the present invention.

In a further variable inductor application, an exemplary oscillator circuit 900 is shown in FIG. 9. The oscillator circuit 900 is, for example, a basic Colpitts oscillator. The tuned network of the inductor 903 and the two capacitors 904 and 905 constitute a resonant network. The voltage source 901, RF choke 902 and resistor 909 provide DC bias to the switch 906. Capacitors 907 and 908 provided AC coupling to the resonant network. Without a variable inductor, the shift in carrier frequency is achieved through a capacitor bank. The capacitor bank may be a number of varactor junction diodes switchably connectable in parallel and series to form capacitors 904 and 905. With the capacitor banks, capacitors of appropriate value are switched in depending on the carrier frequency of interest. The varactor junction diodes also change capacitance when a voltage applied to the capacitors changes. This configuration has the disadvantages of having an excessive number of capacitors, a capacitance setting process dependent on the voltage of the system, a limited voltage range, in efficiencies, and limitations on use of the oscillator for high power applications. In contrast, the use of a variable inductor 903 allows capacitors 904 and 905 to be simple (fixed capacitance) capacitors avoiding these limitations.

The availability of tunable inductors provides significant improvement in each these illustrative applications, and other similar applications. These variable inductors are low-loss, electrically tunable parts for compactness, efficiency and cost benefits. The tunable inductor offers the possibility of achieving a continuous variation in the natural frequency of an LC network in conjunction with a constant capacitor. Thus, the undesirable bank of capacitors can be deleted. Electrical control also enables fine adjustment of the frequency.

It is anticipated that other applications that require tunable LC networks for their operation may benefit from the present invention. Furthermore, although the present invention has been described in terms of discrete components, these exemplary devices may be constructed in part or completely in an integrated circuit format.

The present invention has been described above with reference to an exemplary embodiment. Although the present invention is set forth herein in the context of the appended drawing figures, it should be appreciated that the invention is not limited to the specific form shown. For example, although the invention is described above in connection with a current sensing device, suitable voltage rate of change sensing devices or a combination of voltage and current rate of change sensing devices may be employed in the systems of the present invention. Various other modifications, variations, and enhancements in the design and arrangement of the method and apparatus set forth herein, may be made without departing from the spirit and scope of the present invention. For example, the various components may be implemented in alternate ways, such as varying or alternating the steps in different orders. These alternatives can be suitably selected depending upon the particular application or in consideration of any number of factors associated with the operation of the system. As a further example, various embodiments may be combined such as using both variable inductance and variable duty cycle to regulate the output voltage. In addition, the aspect ratios, number of winding turns, and physical layout of the transformers described herein are exemplary and may be modified to other configurations suitable to design needs. Furthermore, in general, the direction of the output inductor or gating windings and the direction of the gating winding current flow can be clockwise or counter clockwise because both directions generate orthogonal magnetic field lines. These and other changes or modifications are intended to be included within the scope of the present invention.

What is claimed is:

1. A variable inductor comprising:

a gating winding;

a magnetic core;

an inductor winding in communication with the magnetic core and configured to generate core magnetic field lines when current flows though the inductor winding;

a gating core configured to generate gating magnetic field lines orthogonal to and intersecting with the core magnetic field lines when a current flows though the gating winding; and a gating source for providing the current to the gating winding; wherein the variable inductor is further configured to provide stepping between a range of discrete operating frequencies.

2. The variable inductor of claim 1, further comprising a controller configured to cause the gating source to control the current to the gating winding.

3. The variable inductor of claim 1, further comprising a controller configured to provide at least two levels of current in the gating winding.

4. The variable inductor of claim 1, wherein the gating source is configured to provide at least two levels of current in the gating winding, and is configured to create more than one inductance value.

5. The variable inductor of claim 1, the variable inductor further configured to vary inductance of the inductor over a range of inductance values.

6. The variable inductor of claim 1 further configured to provide a fine adjustment over an operating frequency range.

7. A rectifier circuit comprising the variable inductor of claim 1.

8. An amplifier circuit comprising the variable inductor of claim 1.

9. An oscillator circuit comprising the variable inductor of claim 1.

10. A method for efficient voltage regulation, the method comprising the steps of:

magnetically influencing a magnetic path of an output inductor; wherein the magnetic influence creates a first effective inductance in the output inductor during a first time period;

changing the magnetic influence of the magnetic path of the output inductor to create a second effective inductance in the output inductor during a second time period; and controlling a directional inductive device with a controller, wherein the directional inductive device is configured to vary the inductance of the output inductor; wherein the directional inductive device is configured with a gating source, a gating winding, a gating core, an output inductor winding, and an inductor core; and wherein the gating core is configured to control the presence of magnetic field lines in relation to a plurality of field lines in the output inductor core by varying the effective gap length in the inductor core.

11. The method of claim 10, wherein the first time period represents a time period when a transformer secondary winding provides a positive voltage.

12. The method of claim 11, the second time period represents a time period when a transformer secondary winding provides a negative voltage.

13. The method of claim 10, wherein the directional inductive device is configured to vary the inductance in a combined core by varying a gating current in a gating winding.

14. The method of claim 10, wherein the directional inductive device is configured to vary the inductance in a combined core by varying a volt-second product applied to the gating winding.

15. A method for providing voltage regulation comprising the steps of:

providing a first control signal from an inductance controller to an orthogonal inductive device configured to create a first inductance in an output inductor during a time period Ton;

providing a second control signal from an inductance controller to an orthogonal inductive device configured to create a second inductance in the output inductor during a time period Toff; and varying at least one of the first inductance and second inductance to regulate a voltage output; wherein the varying step further comprises the step of varying an effective gap length of an inductor core.

16. The method of claim 15 further comprising the step of varying a duty cycle to regulate the voltage output.

17. The method of claim 15 further comprising the step of varying a phase relationship of the inductance change to the ON and OFF times to regulate a voltage output.

18. A voltage regulation system comprising:

a controller configured to vary the inductance of an output inductor;

an orthogonal inductive device configured to vary the inductance of the output inductor as directed by the controller;

an AC power source in communication with a power transformer; the power transformer being configured in communication with the orthogonal inductive device; and an output load in communication with the orthogonal inductive device, wherein the voltage regulation system is further configured to vary an effective gap length of an inductor core.

19. The voltage regulation system of claim 18 further configured to varying the inductance of the output inductor to generate at least a first inductance and a second inductance; wherein the first and second inductances are configured to regulate a voltage output.

20. The voltage regulation system of claim 18 further configured to vary a duty cycle to regulate the voltage output.

21. The voltage regulation system of claim 18 further configured to vary a phase relationship of the inductance change to the ON and OFF times to regulate a voltage output.

22. The voltage regulation system of claim 18 the orthogonal inductive device further comprising an output inductor.

* * * * *